May 21, 1963 G. E. SMITH ETAL 3,090,207

THERMOELECTRIC BEHAVIOR OF BISMUTH-ANTIMONY THERMOELEMENTS

Filed March 22, 1962 2 Sheets-Sheet 1

INVENTORS G. E. SMITH
R. WOLFE
BY [signature]
ATTORNEY

May 21, 1963 G. E. SMITH ETAL 3,090,207
THERMOELECTRIC BEHAVIOR OF BISMUTH-ANTIMONY THERMOELEMENTS
Filed March 22, 1962 2 Sheets-Sheet 2

INVENTORS G.E. SMITH
R. WOLFE
BY [signature]
ATTORNEY

United States Patent Office 3,090,207

Patented May 21, 1963

3,090,207

THERMOELECTRIC BEHAVIOR OF BISMUTH-ANTIMONY THERMOELEMENTS

George E. Smith, Berkeley Heights, and Raymond Wolfe, New Providence, N.J., assignors to Bell Telephone Laboratories, Incorporated, New York, N.Y., a corporation of New York Filed Mar. 22, 1962, Ser. No. 181,667
6 Claims. (Cl. 62—3)

This invention relates to the improvement of the thermoelectric performance of Bi-Sb alloys. More specifically it concerns the unexpected increase in the thermoelectric figure of merit of such materials obtained by applying a magnetic field to the thermoelectric body.

Typical thermoelectric devices comprise a single junction or combination or junctions between dissimilar materials. The free ends of the materials are connected to a current source. Depending upon the direction of current flow the junction is heated or cooled. This is termed the Peltier effect and is a promising mechanism for achieving low temperatures such as those necessary for the operation of many devices such as microwave generators and amplifiers or optical maser devices.

The opposite effect, i.e., the generation of current responsive to temperature differentials betwen thermoelectric junctions, may also be obtained. This is the Seebeck effect and is commonly used for thermometry particularly at elevated temperatures and for energy conversion.

In connection with the present invention, of particular interest are thermoelectric refrigerators which are capable of providing efficient and economic cooling.

It has recently been discovered that bismuth-antimony alloys are extremely effective thermoelectric materials particularly for operation between low temperatures. This invention is disclosed and claimed in copending application Serial No. 69,743 filed May 20, 1960. It has now been found that the thermoelectric effect in these materials can be significantly enhanced by subjecting the thermoelectric element to a magnetic field. In this manner thermoelectric power generation at low temperatures, as measured by the conventionally used figure of merit, is promoted to a degree heretofore unobtainable in even the best of the known thermoelectric materials. At room temperature significant improvements are also obtained.

The figure of merit, Z, is specifically defined as:

$$Z=\frac{\alpha^2\sigma}{K}$$

where $\alpha$ is thermoelectric power of the material, $\sigma$ is the conductivity of the material, and K is the specific thermal conductivity of the material. This definition and its significance is more fully treated in "Thermoelements and Thermoelectric Cooling" by Ioffe, published by Infosearch, Ltd., London (1957).

It has been found that the Z value may be significantly increased through the use of this invention in bismuth-antimony alloys having compositions of 3 to 40% antimony, remainder bismuth. These limits are readily predictable from a consideration of the energy level picture of the conduction band electrons and valence band holes for the bismuth and antimony atoms at various alloy compositions. At low antimony concentrations, e.g., 3%, the bismuth conduction band electrons and valence band holes overlap slightly while the antimony hole and electron energy levels are widely spread at either side of the bismuth levels. Thus, the electronic properties of the alloy are determined by the bismuth component. With the addition of antimony the electrons and hole bands remain essentially unchanged in that the effective masses are similar. However, the energy levels of the bands shift such that when the composition 40% antimony is reached, the energy levels of the bismuth conduction electrons and valence holes have diverged and those of the corresponding antimony charge carriers have converged to the point where the electronic behavior of alloys having in excess of 40% antimony are dominated by the antimony carriers and may not be predictable from the properties of the low-antimony or bismuth-dominated alloys.

These and other aspects of this invention may be more fully understood from the following detailed description:

Figure 1:
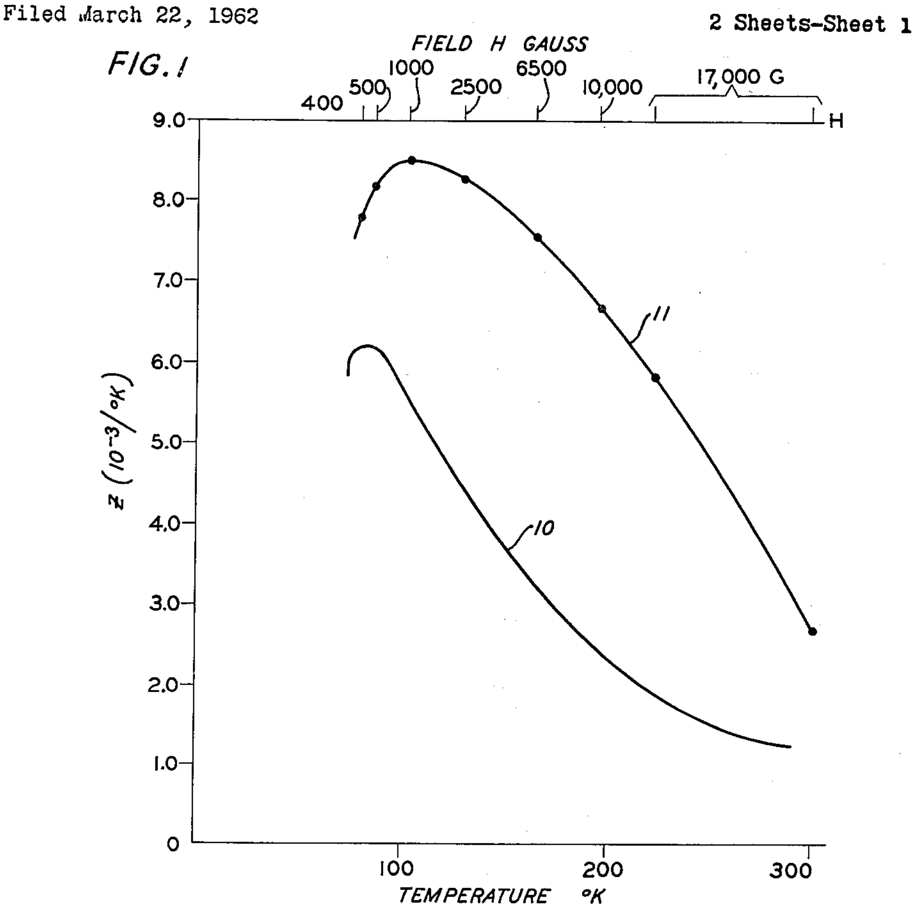
FIG. 1 is a plot of the thermoelectric figure of merit, Z, vs. temperature for an alloy having the composition 88 atomic percent bismuth—12 atomic percent antimony subject to a field of the indicated intensities and also, for comparison, a curve for the same material in the absence of a magnetic field.

The curve 10 of FIG. 1 is a plot of the thermoelectric figure of merit, Z, vs. temperature for an 88 atom percent Bi—12 atom percent Sb crystal. The crystal was prepared by mixing stoichiometric quantities of the pure constituents and zone leveling according to well known procedures to obtain a high quality single crystal. For a treatment of zone leveling see "Zone Melting" by W. G. Pfann, published by John Wiley and Sons, New York, (particularly chaper 7). The current direction for these measurements was along the trigonal axis.

The curve 11 of FIG. 1 was obtained in the same manner as curve 10 except that the crystal sample was subjected to a magnetic field. The magnetic field intensity required to obtain the indicated Z values is shown on the upper scale of the plot.

It is seen that at room temperature a field of 17,000 gauss produces an increase in Z from 1.2 to $2.8\times10^{-3}/°$ K. Similar results were achieved over the entire temperature range from room temperature to below 100° K. Note that the field strengths necessary to achieve the indicated results decrease strikingly at lower temperatures so that at 78° K. only 400 gauss produced a comparable increase in the Z value. The Z values above 220° K. were obtained with a field of 17 kilogauss which was the maximum field available with the equipment used. It is expected that higher field strengths will produce an even greater increase in the Z value over this range.

Figure 2:
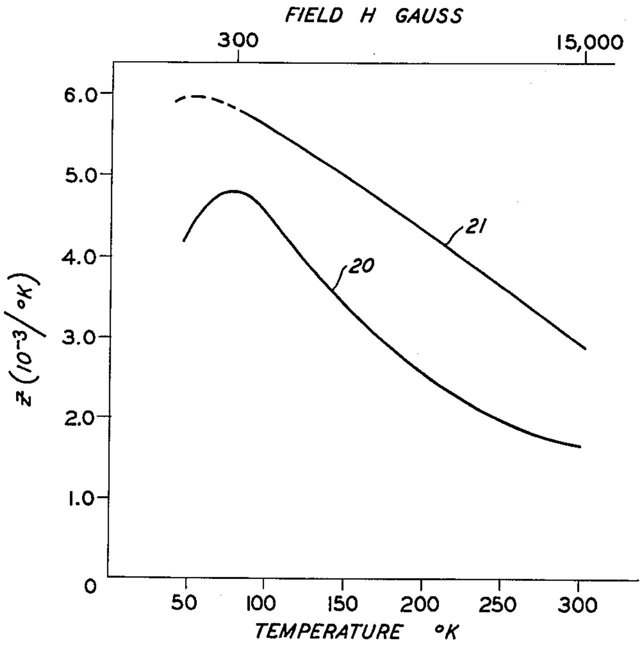
FIG. 2 is a plot similar to that of FIG. 1, directed to the composition 95% bismuth—5% antimony.

FIG. 2 presents data in the same manner as FIG. 1 for the composition 95% bismuth—5% antimony. Here again, substantial increases in the Z value were obtained, as seen from curve 21. Curve 20 is a reference curve giving the Z values for the alloy in the absence of a field. At room temperature a 15 kilogauss field produced an approximate increase in Z of 1.1 or an improvement of about 60% while only 300 gauss gave a similar absolute improvement at 79° K.

Figure 3:
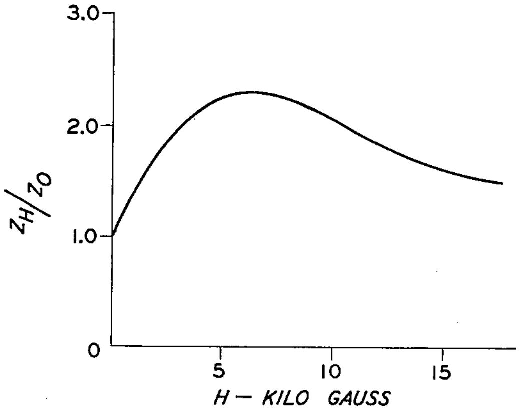
FIG. 3 is a plot of magnetic field strength vs. the ratio of $Z_H$ (with field applied) to $Z_o$ (with no field) for an 88% bismuth—12% antimony alloy at 160° K.

FIG. 3 illustrates the optimum field strength to obtain maximum increase in Z at a given temperature, here 160° K. The field in kilogauss is plotted against $$\frac{Z_H}{Z_0}$$

the ratio of the figure of merit with field applied to the figure of merit with no field. As is seen there is a peak ratio indicating that further increases in field strengths are less effective. However, it will be appreciated from FIG. 3 that fields of a magnitude which depart from the optimum still may provide significant improvements in the figure of merit. Since all field values applied (up to 15 kilogauss) resulted in improved thermoelectric behavior, this invention is not restricted to optimum field values. Thus, fields in excess of 100 gauss are considered as obtaining the desired ends of this invention.

Thermoelectric devices constructed of this material are advantageously formed from a single crystal with the electric field in a preferred crystal direction. For the alloys to which this invention is directed the preferred current or heat flow direction is parallel to the three fold symmetry or trigonal axis. The magnetic field direction is not critical. Effective results were obtained with the field parallel to the bisectrix axis. Other field directions, both electric and magnetic, will also provide useful and unexpected improvements.

It should be understood that while single crystal alloy bodies provide the most desirable results, polycrystalline materials may also be significantly improved by the utilization of a magnetic field as prescribed by this invention.

Figure 4:
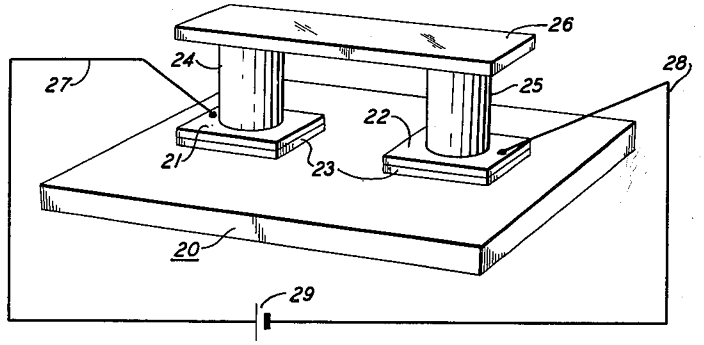
FIG. 4 is a perspective view of a thermoelectric element constructed according to this invention.

FIG. 4 shows a typical thermoelectric device. A brass base 20 supports two copper conductor plates 21 and 22. These plates are electrically insulated from the base member by insulating adhesive 23. A p-type bar 24 is affixed to plate 21 and an n-type bar 25 is attached to plate 22. The n-type material is a bismuth-antimony alloy (3 to 40% antimony). The crystal is cut with its long dimension parallel to the trigonal axis. The other material of the thermoelement may be any of a number of known thermoelectric materials or may be merely a conductor such as copper in which event a single junction element results. The device of FIG. 4 is a two junction element in which the common conductor is the plate 26 which may be of copper. The p-type bar is advantageously a good thermoelectric material such as bismuth telluride ($Bi_2Te_3$). Conductor wires 27 and 28 are attached to a current source 29 capable of delivering, for instance, 15 amps. at 0.1 volt.

The size of the arms 24 and 25 will vary according to the cooling capacity desired. A typical element such as that utilized to obtain the data of FIG. 1 is eight millimeters long and ten square millimeters in cross section.

As prescribed above the alloy composition may vary from 3 to 40% antimony, remainder bismuth. With pure components, alloys in this range are n-type; however, p-type materials can be obtained using appropriate doping materials. To this end small amounts, generally less than 1%, of accepter impurities such as lead or tin are added. P-type material prepared in this way, can be used in combination with an n-type arm to obtain a combined element having extremely efficient thermoelectric operation. It is also evident that the material of this invention, of either conductivity type, can be used to advantage with any known suitable material as the remaining arm. Moreover, such elements are generally advantageously employed in thermopiles wherein each unit or group of units cools over a given increment of the total thermal variation.

Certain other minor additions of substances to the alloy composition such as tellurium or selenium may be used to provide desired variations in thermoelectric behavior to suit specific applications.

The means for applying the magnetic field is not a feature of this invention and may be any conventional magnet capable of providing the desired field strength. It is essential only that the thermoelectric body be placed within the field. For multiple element devices such as thermopiles it would appear desirable that each element or group of elements having a common operating temperature have its own magnet associated therewith. Thus, the field strength may be adjusted according to values prescribed by data such as that in FIG. 1 and FIG. 2. Alternatively all or most of the elements may be operated in fields exceeding those required by the data of FIGS. 1 and 2 in which case a single fixed field source would suffice.

Various modifications and additions to this invention will become apparent to those skilled in the art. All such variations and deviations which basically rely on the fundamental concepts through which this invention has advanced the art are properly considered within the spirit and scope of this invention.

What is claimed is:

1. A thermoelectric device comprising at least one couple one element of which is a bismuth-antimony alloy having between 3 to 40% antimony and means for subjecting said element to a magnetic field of at least 100 gauss.

2. The device of claim 1 including means for directing an electric current along the trigonal axis of said body.

3. The device of claim 1 wherein the said element is n-type and the device includes in combination therewith a p-type body of $Bi_2Te_3$.

4. The device of claim 1 wherein the element contains up to 1% of an impurity.

5. The device of claim 1 wherein the element consists essentially of 88% bismuth—12% antimony.

6. The device of claim 1 wherein the element consists essentially of 95% bismuth—5% antimony.

References Cited in the file of this patent

UNITED STATES PATENTS 2,998,707 Meess ---------------- Sept. 5, 1961

OTHER REFERENCES

Ettingshausen Effect and Thermomagnetic Cooling, pages 1010–1012, Journal of Applied Physics, volume 29, Number 7, July 1958.